United States Patent [19]

Drye et al.

[11] Patent Number: 4,890,156
[45] Date of Patent: Dec. 26, 1989

[54] MULTICHIP IC MODULE HAVING COPLANAR DICE AND SUBSTRATE

[75] Inventors: James E. Drye, Mesa; Steven L. Post, Tempe, both of Ariz.

[73] Assignee: Motorola Inc., Schaumburg, Ill.

[21] Appl. No.: 205,970

[22] Filed: Aug. 5, 1988

Related U.S. Application Data

[62] Division of Ser. No. 25,687, Mar. 13, 1987, Pat. No. 4,792,533.

[51] Int. Cl.<sup>4</sup> ...................... H01L 23/02; H01L 23/12
[52] U.S. Cl. .......................................... 357/74; 357/72; 357/80; 357/81
[58] Field of Search ...................... 357/74, 73, 80, 81, 357/71, 72

[56] References Cited

U.S. PATENT DOCUMENTS

| | | | |
|---|---|---|---|
| 4,466,181 | 8/1984 | Takishima | 357/75 X |
| 4,630,096 | 12/1986 | Drye et al. | 357/81 |
| 4,675,985 | 6/1987 | Goto | 357/72 X |
| 4,722,914 | 2/1988 | Drye et al. | 357/73 X |
| 4,745,455 | 5/1988 | Glascock, II et al. | 357/81 X |
| 4,783,695 | 11/1988 | Eichelberger et al. | 357/65 |
| 4,843,035 | 6/1989 | Takishima | 357/80 X |

Primary Examiner—Andrew J. James
Assistant Examiner—Sara W. Crane
Attorney, Agent, or Firm—Harry A. Wolin

[57] ABSTRACT

A multichip IC module having dice and substrates coplanarly bonded therein. After the dice are aligned into die openings of the substrate, a glass slurry is applied and the module is fired to solidify the glass. Because of shrinkage of the glass slurry firing, a groove results between the dice and the substrate. To fill on this groove, a polyimide or like film is adhered and then pressued and cured on the surface of the dice and substrate. This film is used as a base for interconnect lines.

8 Claims, 1 Drawing Sheet

MULTICHIP IC MODULE HAVING COPLANAR DICE AND SUBSTRATE

This is a division, of application Ser. No. 025,687, filed Mar. 13, 1987, now U.S. Pat. No. 4,792,533.

BACKGROUND OF THE INVENTION

This invention generally pertains to a multichip IC module having coplanar dice and substrate. Generally, in high density integrated circuit module assemblies and the like, it is desirable to have a coplanar relationship between the plurality of dice and the substrate in which the dice are mounted so that future processing steps may be performed with relative ease. U.S. Pat. No. 4,630,096 entitled "High Density IC Module Assembly" which was issued on Dec. 16, 1986 is the type of module that will utilize the present invention.

Previous multichip IC modules of this type have met difficulty in that there is a lack of coplanarity between the dice and the substrate. The dice are generally bonded to the substrate using a glass slurry. Perhaps the most common problem occurs when the glass is fired after it has been applied to the dice and substrate. While the glass is being fired, it shrinks, thereby creating grooves between the substrate and the dice. This lack of coplanarity creates shorting of interconnect lines and step coverage problems due to improper amounts of metal interconnect being disposed in the existing groove. Therefore, a multichip IC module having coplanar dice and substrate which allows easier interconnect line reliability and processing steps are highly desirable.

SUMMARY OF THE INVENTION

The present invention pertains to a multichip IC module having coplanar dice and substrate. To fabricate this IC module, a plurality of dice are aligned so that they may be disposed in predetermined die openings in a silicon wafer substrate. Once these dice are aligned, a glass slurry is applied so that a bond may be formed between the dice and the substrate. After excess glass slurry is cleaned from both the dice and the substrate, the module is fired until the glass becomes solid. Commonly, during this firing, the glass shrinks and grooves are formed between the dice and the substrate. The elimination of this groove is essential in order to obtain coplanarity on the face of the module. To do this, the applying and firing of the glass slurry may be done more than once. Also, to further reduce the groove, a polyimide adhesive is spun onto the face of the dice and substrate and a polyimide film layer is further disposed on the adhesive. This adhesive and polyimide film layer are pressed and cured thereby covering in the unwanted grooves.

It is an object of the present invention to provide a new and improved multichip IC module having coplanar dice and substrate.

It is a further object of the present invention to provide a new and improved multichip IC module having coplanar dice and substrate in which processing steps may be easily performed.

It is a further object of the present invention to provide a new and improved multichip IC module having coplanar dice and substrate wherein this high density integrated circuit module assembly may be cheaply and easily manufactured.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
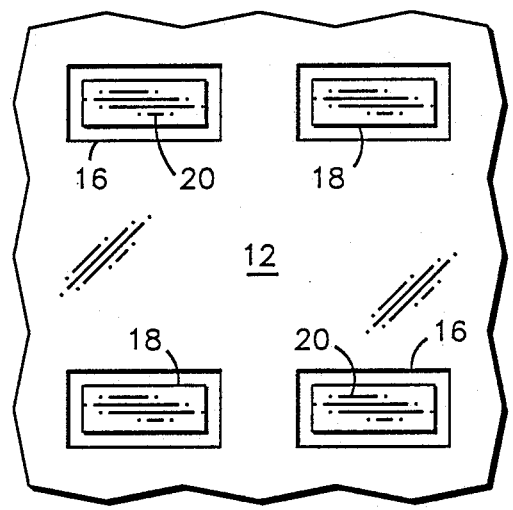
FIG. 1 is a highly enlarged top view of a section of a silicon wafer substrate of the type which is used in the present invention.
Figure 2:
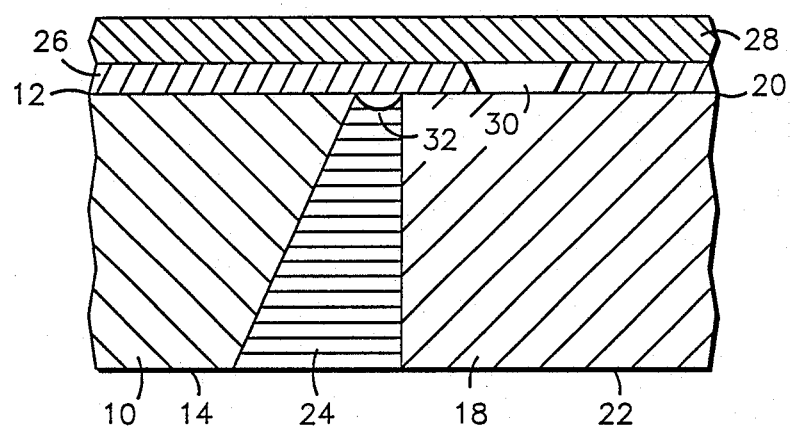
FIG. 2 is a highly enlarged cross sectional view of a die bonded to a silicon wafer substrate as done in the present invention.

Referring specifically to FIG. 1, a highly enlarged top view of a section of a silicon wafer substrate, designated 10, and FIG. 2, a highly enlarged cross-sectional view of a die bonded to silicon wafer substrate 10 are shown. Silicon wafer 10 has a first surface, 12, and a second surface, 14. Further, silicon wafer 10 includes a plurality of die openings, 16, which are formed in silicon wafer 10 by etching or other methods well known in the art. Each member of a plurality of dice, 18, include a first surface, 20, and a second surface, 22. Members of plurality of dice 18 are disposed throughout silicon wafer 10 in die openings 16. Plurality of dice 18 are disposed in die openings 16 of silicon wafer 10 so that first surfaces 20 of plurality of dice 18 face in the same direction as first surface 12 of silicon wafer 10 and substantially lie in a common plane. Respectively, second surface 22 of plurality of dice 18 face in the same direction as second surface 14 of silicon wafer 10. Plurality of dice 18 are disposed and aligned on a vacuum plate which is specially designed so that silicon wafer 10 also may be aligned with respect to plurality of dice 18 on the same vacuum plate thereby allowing for a predetermined relationship between silicon wafer 10 and plurality of dice 18.

Once plurality of dice 18 are disposed and aligned in the predetermined relationship with respect to silicon wafer 10, a slurry of glass, 24, is applied to silicon wafer 10 and plurality of dice 18 so as to bond them together. Once glass 24 is applied in slurry form, silicon wafer 10 and plurality of dice 18 remain on the vacuum plate until glass 24 hardens slightly. Then silicon wafer 10 and plurality of dice 18 are removed and excess glass 24 is cleaned from both the first surface 12 and second surface 14 of silicon wafer 10 as well as first surfaces 20 and second surfaces 22 of plurality of dice 18. Once this cleaning has been accomplished, silicon wafer 10 and plurality of dice 18 are fired so that glass 24 will melt and form a solid bond between silicon wafer 10 and dice 18. The temperature at which the firing takes place is determined by the type of glass 24 which is used. Commonly, CF6 Nippon Electric Glass with a 15% $SiO_2$ filler is used. A predetermined amount of terpineol is used so that the glass may be applied in slurry form. Because glass 24 will have a certain amount of shrinkage when fired it is possible that the process of applying the glass slurry, cleaning and firing be performed more than once.

Following the firing of silicon wafer 10, plurality of dice 18 and glass 24, a small groove, 32, may still exist due to the shrinkage of glass 24 during firing. Groove 32 will cause many problems in future processing steps, some of these problems being step coverage and the shorting of interconnect lines. In order that these problems do not occur, it is desirable to eliminate groove 32 so that first surface 12 of silicon wafer 10 and first surfaces 20 of plurality of dice 18 as well as areas in between them are coplanar. The coplanarity is achieved by applying a polyimide or like film to first surface 12 of silicon wafer 10 and first surfaces 20 of plurality of dice 18.

Initially, a polyimide adhesive layer, 26, is spun on to first surface 12 of silicon wafer 10 and first surfaces 20 of dice 18. Adhesive layer 26 is commonly between 0.5 and 5 microns. 2555 made by the Dupont Company is used as an adhesive for this application. Additionally, it might be desirable to pre-pattern adhesive layer 26 in desired areas so that future processing steps may be more easily performed. A via 30 is shown to have been pre-patterned in FIG. 2. It is desirable to pre-pattern in predetermined areas such as the contact pads of dice 18 to make them more easily accessible for future processing steps. For example, if via 30 is above a bonding area of die 18, the pre-patterning eliminates the need for patterning this area in the future. Once adhesive layer 26 has been applied to silicon wafer 10 and plurality of dice 18, a polyimide film layer, 28, is applied over adhesive layer 26. Commonly film layer 28 may be of a film such as Kapton which is made by the Dupont Company. Additionally, film layer 28 is commonly between 8.0 and 24.0 microns thick. Once film layer 28 has been disposed on adhesive layer 26, it must be pressed and cured. When using Kapton film, pressing and curing takes place at a pressure of 1500 to 2000 psi, a temperature of 250 to 350 degrees centigrade and a time of 6 to 10 minutes. These variables may differ depending on the type of film used. Additionally, it should be understood that a film layer 28 initially incorporating an adhesive layer 26 may be used rather than using the previously described two-step process. The addition of film layer 28 and adhesive layer 26 essentially eliminates groove 32 when pressed thereby allowing for future processing steps to be performed with relative ease.

Figure 3:
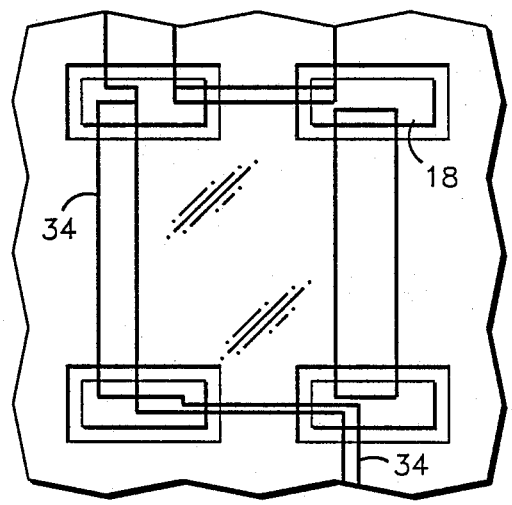
FIG. 3 is a highly enlarged top view of a section of a silicon wafer substrate including plurality of dice having interconnect lines processed thereon in accordance with the present invention.

Referring specifically to FIG. 3, a highly enlarged top view of a section of silicon wafer 10 including plurality of dice 18 and further having a plurality of interconnect lines, 34, is shown. Once the application of film layer 28 has been completed, the processing of interconnect lines 34 may begin. To do this, film layer 28, adhesive layer 26 and predetermined areas of first surface 12 of silicon wafer 10 as well as first surfaces 20 of dice 18 must be patterned and etched so that the interconnnect lines 34 may be processed. Any pre-patterned vias 30 will be employed at this stage and will allow for a decreased amount of patterning and etching. Because film layer 28 and adhesive layer 26 have been applied, interconnect lines 34 may be processed on a module having greatly increased planarity.

Thus it is apparent that there has been provided, in accordance with the invention, an improved multichip IC module having coplanar dice substrate which meets the objects and advantages set forth above. While we have shown and described specific embodiments of this invention, further modifications and improvements will occur to those skilled in the art. We desire to be understood, therefore, that this invention is not limited to the particular form shown and we intend in the appended claims to cover all modifications which do not depart from the spirit and scope of this invention.

What is claimed is:

1. A multichip integrated circuit module having coplanar dice and substrate comprising:
   a silicon wafer having a first surface, a second surface and a plurality of die openings therethrough;
   a plurality of dice each having a first surface and a second surface, said plurality of dice glass bonded into said plurality of die openings of said silicon wafer so that said first surface of said silicon wafer and said first surfaces of said plurality of dice lie in a common plane; and
   a layer of polyimide film adhered and pressed to said first surfaces of said silicon wafer and said plurality of dice.

2. The multichip integrated circuit module of claim 1 further comprising at least one pre-patterned via.

3. The multichip circuit module of claim 1 wherein the polyimide film layer, the first surfaces of the plurality of dice and the first surface of the silicon wafer have been patterned and etched in predetermined areas and a plurality of metal interconnect lines processed thereon.

4. The multichip integrated circuit module of claim 1 wherein the layer of polyimide film is adhered to the first surfaces of the silicon wafer and the plurality of dice by a polyimide adhesive layer having a thickness in the range of 0.5 to 5.0 microns.

5. The multichip integrated circuit module of claim 1 wherein the layer of polyimide film has a thickness in the range of 8.0 to 24.0 microns.

6. The multichip integrated circuit module of claim 1 wherein the layer of polyimide film is pressed and cured at a pressure in the range of 1500 to 2000 psi, a temperature in the range of 250 to 350 degrees centigrade and for a time in the range of 6 to 10 minutes.

7. A multichip integrated circuit module having coplanar dice and substrate comprising:
   a silicon wafer having a first surface, a second surface and a plurality of die openings therethrough;
   a plurality of dice each having a first surface and a second surface, said plurality of dice glass bonded into said plurality of die openings of said silicon wafer so that said first surface of said silicon wafer and said first surfaces of said plurality of dice lie in a common plane; and
   a layer of polyimide adhered and pressed to said first surfaces of said silicon wafer and said plurality of dice, said polyimide film having a thickness in the range of 8.0 to 24.0 microns and being adhered by a polyimide adhesive layer having a thickness in the range of 0.5 to 5.0 microns.

8. The multichip integrated circuit module of claim 7 wherein the layer of polyimide film is pressed and cured at a pressure in the range of 1500 to 2000 psi, a temperature in the range of 250 to 350 degrees centigrade and for a time in the range of 6 to 10 minutes.

* * * * *